United States Patent
Mani

(10) Patent No.: US 9,620,411 B2
(45) Date of Patent: Apr. 11, 2017

(54) MAGNETIC SIDEWALLS FOR WRITE LINES IN FIELD-INDUCED MRAM AND METHODS OF MANUFACTURING THEM

(71) Applicant: III HOLDINGS 1, LLC, Wilmington, DE (US)

(72) Inventor: Krishnakumar Mani, San Jose, CA (US)

(73) Assignee: III HOLDINGS 1, LLC, Wilmington, DE (US)

(*) Notice: Subject to any disclaimer, the term of this patent is extended or adjusted under 35 U.S.C. 154(b) by 0 days.

(21) Appl. No.: 15/080,241

(22) Filed: Mar. 24, 2016

(65) Prior Publication Data

US 2016/0240431 A1 Aug. 18, 2016

Related U.S. Application Data

(63) Continuation of application No. 14/101,512, filed on Dec. 10, 2013, now Pat. No. 9,299,744, which is a continuation of application No. 13/340,452, filed on Dec. 29, 2011, now Pat. No. 8,625,340.

(60) Provisional application No. 61/428,161, filed on Dec. 29, 2010.

(51) Int. Cl.

| | |
|---|---|
| *H01L 21/768* | (2006.01) |
| *H01L 43/02* | (2006.01) |
| *H01L 27/22* | (2006.01) |
| *G11C 11/16* | (2006.01) |
| *H01L 21/285* | (2006.01) |
| *H01L 23/522* | (2006.01) |
| *H01L 23/528* | (2006.01) |
| *H01L 43/08* | (2006.01) |

(Continued)

(52) U.S. Cl.
CPC ........ *H01L 21/76816* (2013.01); *G11C 11/16* (2013.01); *H01L 21/2855* (2013.01); *H01L 21/76879* (2013.01); *H01L 23/5226* (2013.01); *H01L 23/5283* (2013.01); *H01L 27/222* (2013.01); *H01L 27/226* (2013.01); *H01L 43/02* (2013.01); *H01L 43/08* (2013.01); *H01L 43/10* (2013.01); *H01L 43/12* (2013.01)

(58) Field of Classification Search
CPC . H01L 21/76816; H01L 27/222; H01L 43/02; H01L 43/08; G11C 11/14–11/16; G11C 11/161

See application file for complete search history.

(56) References Cited

U.S. PATENT DOCUMENTS

| 6,114,937 | A | 9/2000 | Burghartz et al. |
| 6,430,084 | B1 * | 8/2002 | Rizzo ............... G11C 11/16 257/E27.005 |
| 7,006,375 | B2 | 2/2006 | Covington |

(Continued)

FOREIGN PATENT DOCUMENTS

| JP | 359077615 A | 5/1984 |
| JP | 02004235512 A | 8/2004 |

*Primary Examiner* — Allison P Bernstein

(74) *Attorney, Agent, or Firm* — McAndrews, Held & Malloy, Ltd.

(57) ABSTRACT

In one embodiment, there is provided a non-volatile magnetic memory cell. The non-volatile magnetic memory cell comprises a switchable magnetic element; and a word line and a bit line to energize the switchable magnetic element; wherein at least one of the word line and the bit line comprises a magnetic sidewall that is discontinuous.

24 Claims, 9 Drawing Sheets

(51) Int. Cl.
*H01L 43/10* (2006.01)
*H01L 43/12* (2006.01)

(56) References Cited

U.S. PATENT DOCUMENTS

| | | |
|---|---|---|
| 7,307,874 B2 * | 12/2007 | Jeong ..................... G11C 11/15 |
| | | 365/133 |
| 7,755,932 B2 | 7/2010 | Ito et al. |
| 8,625,340 B1 | 1/2014 | Mani |
| 2003/0048658 A1 | 3/2003 | Chen |
| 2009/0296476 A1 | 12/2009 | Shin et al. |
| 2011/0156182 A1 | 6/2011 | Takeuchi et al. |

* cited by examiner c) or e)

g)

h)

i)

MAGNETIC SIDEWALLS FOR WRITE LINES IN FIELD-INDUCED MRAM AND METHODS OF MANUFACTURING THEM

The present application is a continuation of, and claims priority under 35 U.S.C. §120 to, copending U.S. patent application Ser. No. 14/101,512, filed on Dec. 10, 2013, which is a continuation of, and claims priority under 35 U.S.C. §120 to, U.S. patent application Ser. No. 13/340,452, filed on Dec. 29, 2011, now U.S. Pat. No. 8,625,340, which claims priority under 35 U.S.C. §119(e) to provisional application Ser. No. 61/428,161, filed on Dec. 29, 2010. The entire contents of each prior-filed application are hereby expressly incorporated herein by reference.

FIELD

Embodiments of the invention relate to magnetic random access memory (MRAM) devices and methods for their manufacture.

BACKGROUND

Field-induced magnetic random access memory (MRAM) use a current-induced magnetic field generated around metal lines to write data in memory cells. In an MRAM cell one bit of data is stored in a magnetic tunnel junction (MTJ). In field-induced MRAM the MTJ sits in-between two metal lines, the bit line and the word line. Normally, these lines are perpendicular to each other. To write binary data ("0" or "1") in an MTJ cell, enough current must go simultaneously through the bit line and the word line of that particular cell for a certain amount of time. The sense in which the current flows in both metal lines sets a data value of either a "0" or a "1" in the cell.

It is advantageous to MRAM technology to be able to write data in the memory cells with as low a current as possible. Lower current means lower energy and voltage requirements for the memory device, smaller transistors (which may impact positively the memory density), and higher reliability of the metal lines employed in writing the cells is.

SUMMARY

According to one aspect of the invention, there is provided a non-volatile magnetic memory cell, comprising a switchable magnetic element; and a word line and a bit line to energize the switchable magnetic element; wherein at least one of the word line and the bit line comprises a magnetic sidewall that is discontinuous.

According to second aspect of the invention, there is provided memory device, comprising: an array of magnetic memory cells, each cell comprising a switchable magnetic element; and a word line and a bit line to energize the switchable magnetic element; wherein at least one of the word line and the bit line comprises a magnetic sidewall that is discontinuous.

Other aspects of the invention will be apparent from the written description that follows.

DETAILED DESCRIPTION

Figure 1:
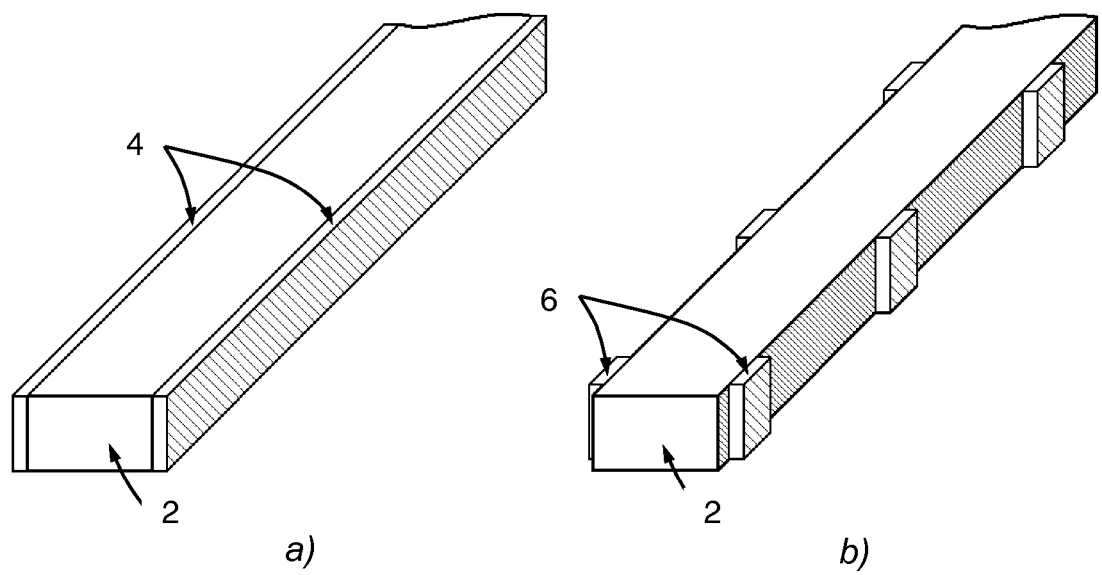
FIG. 1 shows a schematic drawing of metal lines with a) continuous and b) discontinuous magnetic sidewalls, in accordance with one embodiment of the invention.

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although the following description contains many specifics for the purposes of illustration, one skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, embodiments of the present invention disclose MRAM structures with metal lines having magnetic sidewalls in different configurations. In a first configuration, the magnetic sidewalls are continuous and extend along the full length of a metal line. In a second configuration, the magnetic sidewalls are discontinuous and are located at portions of metal lines that are close to the MTJ cells. Advantageously, the magnetic sidewalls reduce the current in the word and bit lines needed to switch the MTJ cells. Embodiments of the present invention also disclose techniques for manufacturing the metal lines.

Referring now to FIG. 1(a), in a first configuration metal line 2 is shown having continuous magnetic sidewalls 4 extending along its entire length. FIG. 1(b) shows the metal line 2 clad with discontinuous metal line, portions of which are indicated with reference numeral 6.

Figure 2:
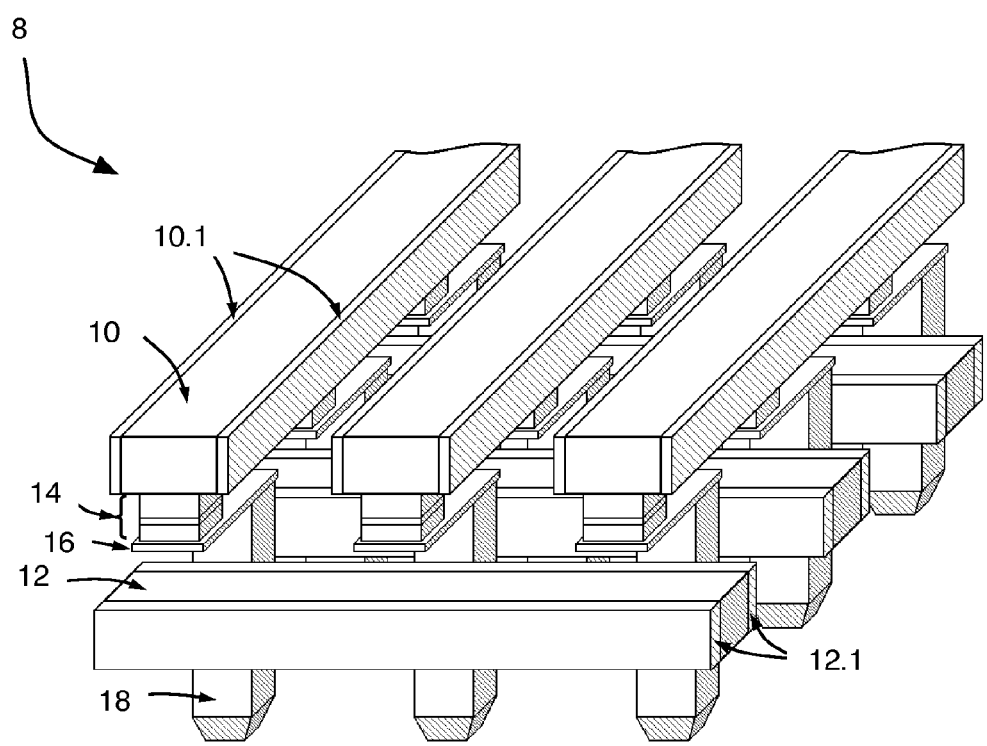
FIG. 2 shows a 3×3 cell array in one MRAM cell configuration with continuous magnetic sidewalls in both bit-lines and word-lines, in accordance with one embodiment of the invention.

Referring now to FIG. 2, reference numeral 8 generally indicates a 3×3 MRAM array, in accordance with one embodiment of the invention. In the array 8, each MRAM cell includes a word line 10 and a bit line 12 with a MTJ stack/element 14 disposed at the intersections of the word and bit lines 10, 12. As will be seen, the word lines 10 have continuous sidewalls 10.1, whereas the bits lines 12 have continuous sidewalls 12.1. Each MTJ 14 is connected to access circuitry (not shown) through a bit line 10, a bottom electrode 16, and a stack 18.

Figure 3:
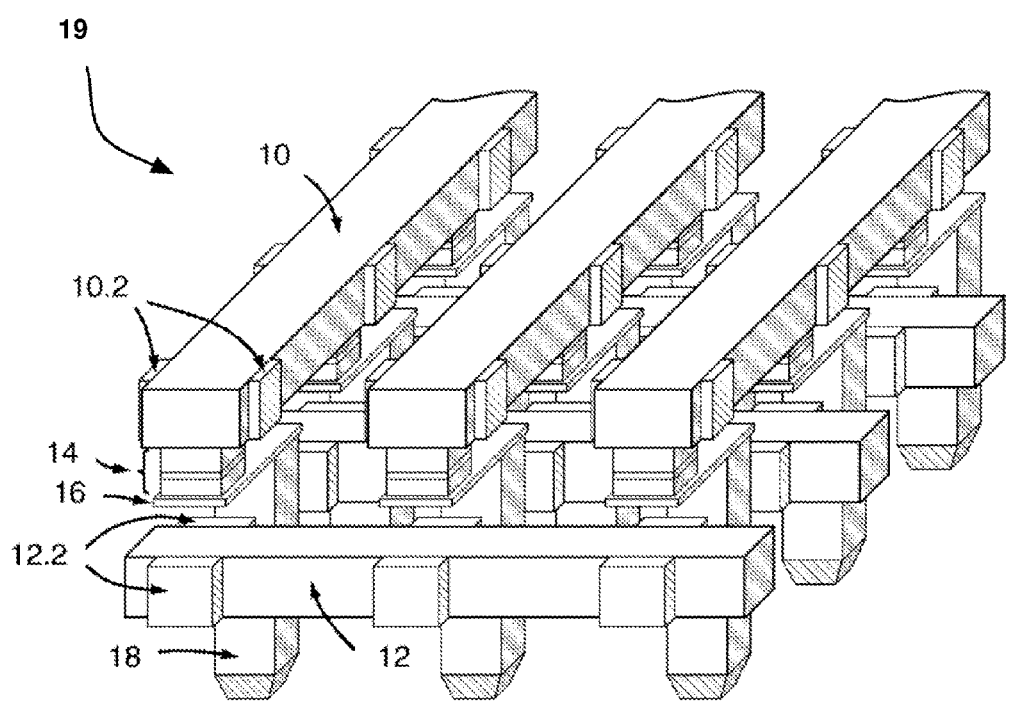
FIG. 3 shows a 3×3 cell array in one MRAM cell configuration with discontinuous magnetic sidewalls in both bit-lines and word-lines, in accordance with one embodiment of the invention.

Referring now to FIG. 3, reference numeral 19 generally indicates a 3×3 MRAM array, in accordance with another embodiment of the invention. In FIG. 2, the same or similar reference numerals used in FIG. 1 are used to indicate the same or similar components. As will be seen, the case of the embodiment of FIG. 3, the bit line 10 includes discontinuous magnetic sidewalls, portions of which are indicated with reference numeral 10.2. Likewise, the word line 12 includes discontinuous magnetic sidewalls, portions of which are indicated with reference numeral 12.2.

In one embodiment, in the case of continuous magnetic sidewalls said sidewalls are magnetically very soft. For this purpose, the magnetic walls may be made of NiFe, NiFeMo alloys or ultrasoft magnetic materials. In one embodiment, the thicknesses of the magnetic layer in the sidewalls are selected to keep the soft properties of the magnetic sidewalls. For example, thin magnetic layers (much less than 10 nm) in the sidewalls are avoided.

In the case of the configuration with discontinuous magnetic sidewalls, said sidewalls may be thin (<10 nm) so as not to overpower the MTJ.

In one embodiment, the aspect ratio of these patterned sidewalls is set carefully and consistently across the memory device. Setting the aspect ratio of the patterned walls involves considering the magnetic switching field of the cell, the cell stability against thermal fluctuations, stray magnetic fields, and half-select. In one embodiment, the patterned magnetic sidewalls have an aspect ratio 1 or close to 1 with the longer side oriented along a top-bottom direction in FIG. 3. The magnetic field for switching the cells as well as the cell stability tends to increase with the aspect ratio of the magnetic sidewalls. For the magnetic sidewalls it is preferable to use materials with very low magneto-crystalline anisotropy, like NiFe, NiFeMo or CoFeB alloys.

Figure 4:
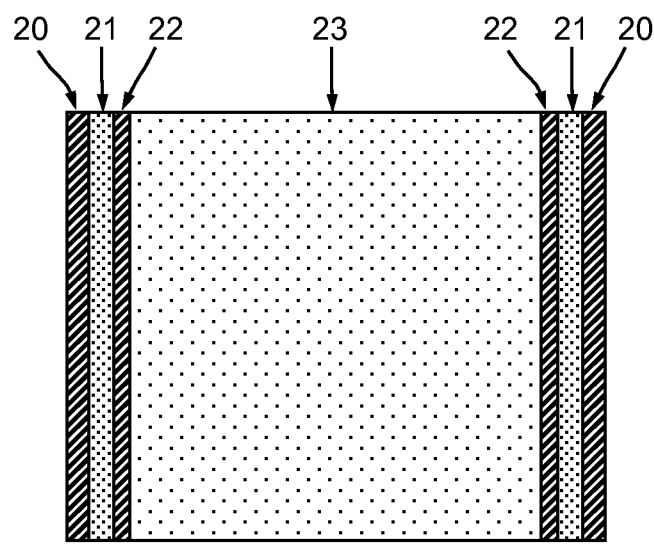
FIG. 4 shows a cross-section through a metal line with magnetic sidewalls composed of a magnetic layer sandwiched by two non-magnetic layers, in accordance with one embodiment of the invention.

In one embodiment, the magnetic sidewalls may be made of several layers. FIG. 4 shows a cross-section through a metal line (word or bit) having three layer magnetic sidewalls. The layers include an outer layer 20, an inner layer 22, and a middle layer 21 sandwiched between the outer layer 20 and the inner layer 22. The layers 20 and 22 are non-magnetic, whereas the middle layer 21 is the magnetic one. The purpose of the outer 22 and the inner 20 layer is to protect the integrity of the magnetic layer 21, so that its thickness is not affected by processing. The innermost layer 20 also helps protect the metal line 23 during processing and helps reduce electro-migration in the metal line 23. The outer and the inner layers may be composed of Ta, or other materials that fit the purpose.

Figure 5:
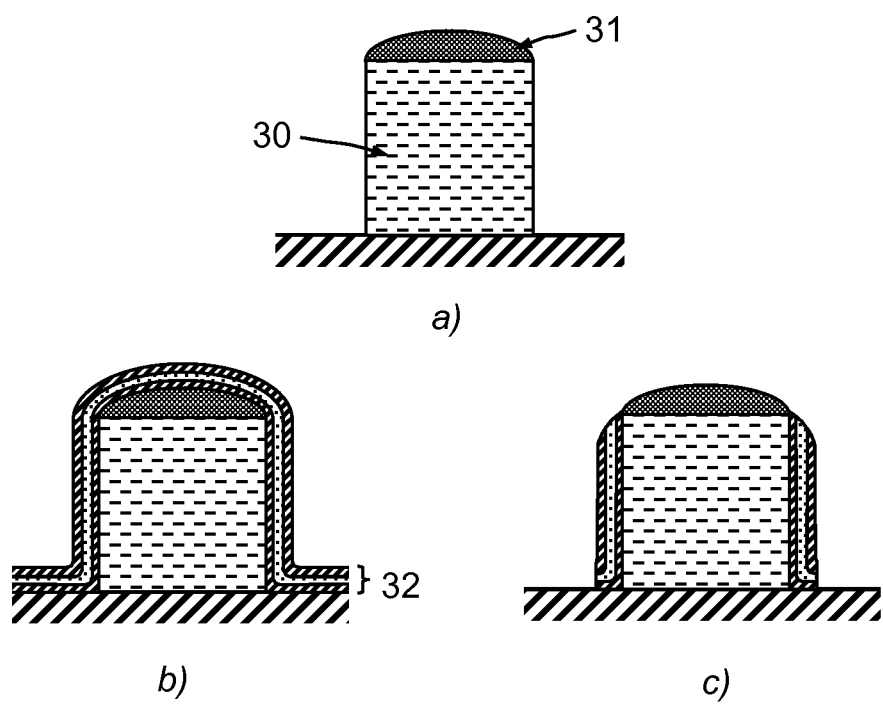
FIG. 5 shows steps in a process flow for manufacturing metal lines with continuous magnetic sidewalls, in accordance with one embodiment of the invention.
Figure 6:
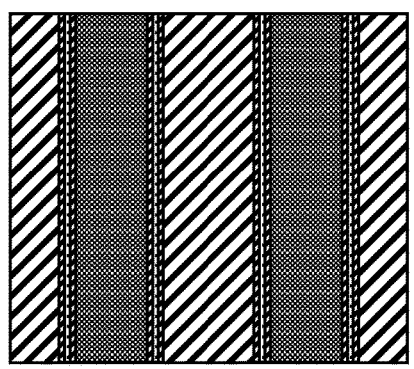
FIG. 6 shows steps in a process flow for manufacturing metal lines with discontinuous magnetic sidewalls, in accordance with one embodiment of the invention.
Figure 6:
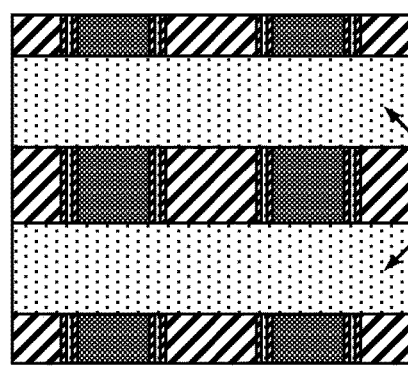
Figure 6:
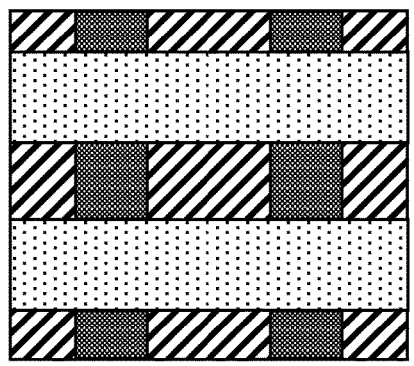
Figure 6:
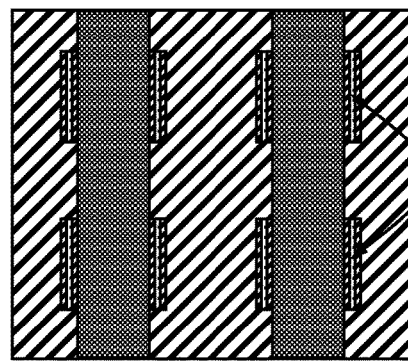

Manufacturing of the magnetic sidewalls can be accomplished by different methods. In case of metal lines defined by etching a metallic layer; like AlCu and W lines, the process flow for manufacturing is shown in FIG. 5. The first step is to define the metal line 30 (FIG. 5 a), which is shown in cross-section. In one embodiment the metal line 30 is defined with the assistance of a hard mask, the remaining of which is denoted as 31. The next step is the deposition of the layers 32 composing the magnetic sidewalls, as shown in FIG. 5 b). In one embodiment the deposition can be made by Physical Vapor Deposition (PVD). The next step (c) is the definition of the walls through anisotropic etching of the deposited layers. In one embodiment this can be accomplished with Reactive Ion Etching (RIE) using for example: chlorine gas mixed with argon. At this point the continuous magnetic sidewalls are already defined along the metal lines. For discontinuous magnetic sidewalls, after step c) a photo-lithography process follows, as shown in plan view in FIG. 6 d). This step is to protect with photo-resist 40 the parts of the magnetic sidewalls that are going to remain. The next step (e) is the etching away of the exposed magnetic sidewalls. After stripping the photo-resist (f), the discontinuous magnetic sidewalls 41 are defined.

Figure 7:
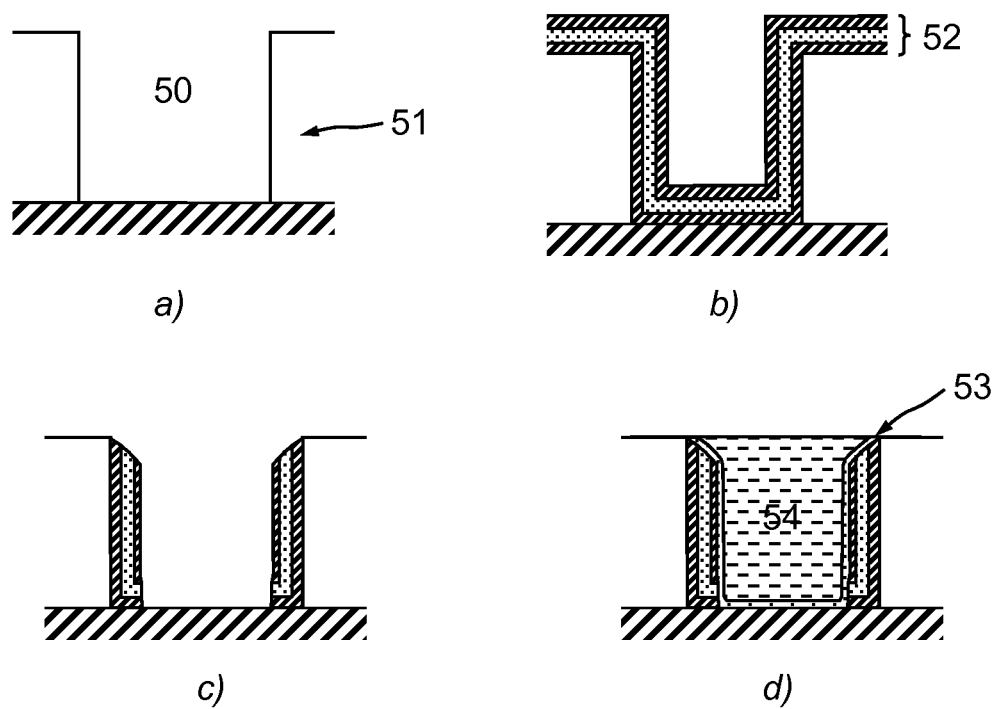
FIG. 7 shows steps in a process flow for manufacturing metal lines with continuous magnetic sidewalls, in accordance with another embodiment of the invention.
Figure 7:
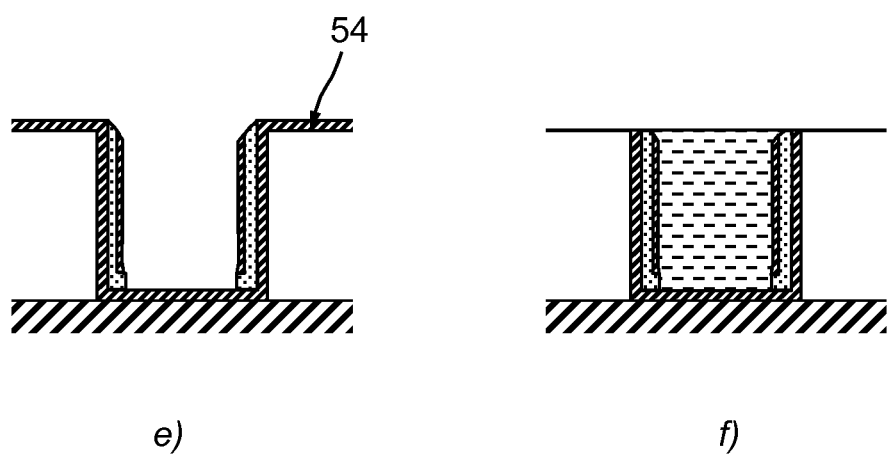
Figure 8:
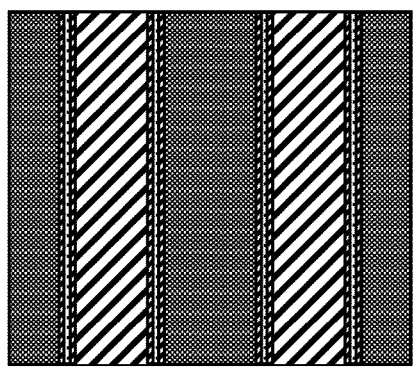
FIG. 8 shows steps in a process flow for manufacturing metal lines with discontinuous magnetic sidewalls, in accordance with another embodiment of the invention.
Figure 8:
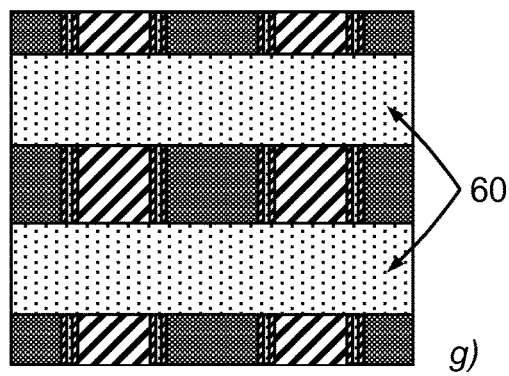
Figure 8:
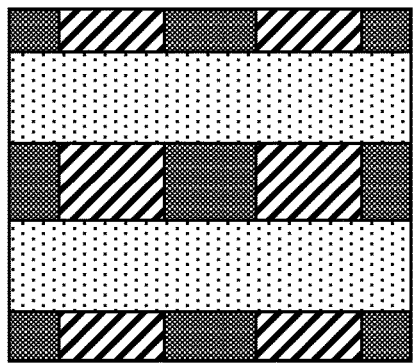
Figure 8:
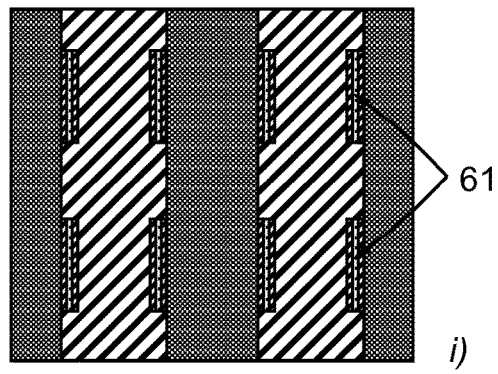

In the case of metallic lines defined by the Damascene method, like Cu lines, the process flow for manufacturing the magnetic sidewalls is shown in FIG. 7. Starting from the groove 50 etched in the dielectric layer 51, the next step is the deposition of the layers 52 composing the magnetic sidewalls. In one embodiment the deposition can be made by PVD. The following step (c) is the definition of the walls through anisotropic etching of the deposited layers. In one embodiment this can be accomplished with RIE using chlorine gas mixed with argon gas. The following step (d) is the filling of the groove with metal and the chemical-mechanical polishing (CMP) down to the dielectric layer. For metal filling a thin metallic seed layer 53 is deposited first. In a different embodiment the innermost metallic layer 54 deposited in b) serves as seed layer for metal filling. For that purpose, step c) is replaced with step e), where the innermost deposited layer is left after RIE. After that, step f) follows which implies metal filling and CMP. Either after step d) or after step f) the result is the definition of continuous magnetic sidewalls along the metal lines. For discontinuous magnetic sidewalls, after step c) or e) a photo-lithography process follows, as shown in plan view in FIG. 8 g). This step is to protect with photo-resist 60 the parts of the magnetic sidewalls that are going to remain. The following step (h) is etching away the exposed magnetic sidewalls. After stripping the photo-resist (i), the discontinuous magnetic sidewalls 61 are defined.

One skilled in the art would be aware of the requirements and specificities of the techniques mentioned above for the purpose of manufacturing the magnetic sidewalls. The manufacturing techniques mentioned herein are not intended to limit the scope of the invention.

The invention claimed is:

1. A method for manufacturing a discontinuous magnetic sidewall of at least one of a word line and a bit line, the method comprising:
   defining the at least one of the word line and the bit line;
   depositing layers on the at least one of the word line and the bit line;
   defining a magnetic sidewall;
   protecting discontinuous portions of the defined magnetic sidewall, wherein non-protected portions define exposed portions; and
   removing the exposed portions.

2. The method of claim 1, wherein said depositing layers is done by Physical Vapor Deposition (PVD).

3. The method of claim 1, wherein the at least one of the word line and the bit line is defined with assistance of a hard mask.

4. The method of claim 1, wherein the magnetic sidewall is defined by performing anisotropic etching of the deposited layers.

5. The method of claim 1, wherein the magnetic sidewall is defined by performing reactive ion etching of the deposited layers.

6. The method of claim 5, wherein said performing reactive ion etching of the deposited layers uses chlorine gas mixed with argon gas.

7. The method of claim 1, wherein the discontinuous portions are rectangular.

8. The method of claim 1, wherein the discontinuous portions have an aspect ratio of 1.

9. The method of claim 1, wherein the discontinuous portions have a thickness that is less than 10 nm.

10. The method of claim 1, wherein the layers comprise an inner layer, an outer layer, and a middle layer sandwiched between the inner and outer layers.

11. The method of claim 10, wherein the middle layer is magnetic.

12. The method of claim 10, wherein the inner and outer layers are non-magnetic.

13. A method for manufacturing a discontinuous magnetic sidewall of at least one of a word line and a bit line, the method comprising:
    etching a groove in a dielectric layer;
    depositing layers in the groove;
    defining a magnetic sidewall;
    protecting discontinuous portions of the defined magnetic sidewall, wherein non-protected portions define exposed portions; and
    removing the exposed portions.

14. The method of claim 13, wherein said depositing layers is done by Physical Vapor Deposition (PVD).

15. The method of claim 13, wherein the magnetic sidewall is defined by performing anisotropic etching of the deposited layers.

16. The method of claim 13, wherein the magnetic sidewall is defined by performing reactive ion etching of the deposited layers.

17. The method of claim 16, wherein said performing reactive ion etching of the deposited layers uses chlorine gas mixed with argon gas.

18. The method of claim 16, wherein:
    the layers comprise an inner layer, an outer layer, and a middle layer sandwiched between the inner and outer layers; and
    the inner layer is left at a bottom of the groove after the magnetic sidewall is defined.

19. The method of claim 13, wherein the discontinuous portions are rectangular.

20. The method of claim 13, wherein the discontinuous portions have an aspect ratio of 1.

21. The method of claim 13, wherein the discontinuous portions have a thickness that is less than 10 nm.

22. The method of claim 13, wherein the layers comprise an inner layer, an outer layer, and a middle layer sandwiched between the inner and outer layers.

23. The method of claim 22, wherein the middle layer is magnetic.

24. The method of claim 22, wherein the inner and outer layers are non-magnetic.

* * * * *